United States Patent [19]

Damen

[11] Patent Number: 5,513,203
[45] Date of Patent: Apr. 30, 1996

[54] SURFACE EMITTING LASER HAVING IMPROVED PUMPING EFFICIENCY

[75] Inventor: Theodoor C. Damen, Colts Neck, N.J.

[73] Assignee: AT&T Corp., Murray Hill, N.J.

[21] Appl. No.: 417,308

[22] Filed: Apr. 5, 1995

[51] Int. Cl.$^6$ .......................... H01S 3/085; H01S 3/094; H01S 3/18
[52] U.S. Cl. .................. 372/96; 372/50; 372/70
[58] Field of Search ................. 372/96, 92, 50

[56] References Cited

U.S. PATENT DOCUMENTS

| | | | |
|---|---|---|---|
| 4,395,769 | 7/1983 | Damen et al. | 372/43 |
| 4,718,070 | 1/1988 | Liau et al. | 372/50 |
| 4,881,236 | 11/1989 | Brueck et al. | 372/45 |
| 4,949,350 | 8/1990 | Jewell et al. | 372/45 |
| 4,999,842 | 3/1991 | Huang et al. | 372/45 |
| 5,034,344 | 7/1991 | Jewell et al. | 437/129 |
| 5,206,872 | 4/1993 | Jewell et al. | 372/46 |
| 5,258,990 | 11/1993 | Olbright et al. | 372/46 |

*Primary Examiner*—Rodney B. Bovernick
*Assistant Examiner*—Robert McNutt
*Attorney, Agent, or Firm*—Stuart H. Mayer

[57] ABSTRACT

In accordance with the present invention, a surface emitting laser includes a substrate, a first distributed feedback mirror formed on the substrate, and an active gain medium formed on the first mirror. The active gain medium includes at least one active, optically emitting layer and one barrier layer. A second distributed feedback mirror is formed on the active gain medium. The first and second mirrors define a resonant cavity for supporting a standing wave optical field at a designed wavelength of operation. The first and second mirrors have first and second reflective bandwidths that respectively include first and second transmissive bandwidths for receiving optical pumping energy. The first and second reflective bandwidths are shifted in wavelength relative to one another so that the first and second transmissive bandwidths are located at distinct wavelengths.

12 Claims, 3 Drawing Sheets

SURFACE EMITTING LASER HAVING IMPROVED PUMPING EFFICIENCY

FIELD OF THE INVENTION

The present invention relates generally to surface emitting lasers and more particularly to a surface emitting laser having improved pumping efficiency.

BACKGROUND OF THE INVENTION

Surface emitting lasers emit laser radiation in a direction perpendicular to the substrate surface. Such lasers have numerous advantages over edge-emitting lasers, including their extremely small size and the relative ease with which a great number of such lasers can be fabricated in a two-dimensional array on a single substrate.

Known surface emitting lasers include a resonant cavity defined by two distributed feedback (DFB) mirrors. The cavity contains a gain medium comprising spacer layers and active, optically emitting layers. Optical pumping of the active layers is achieved by transmitted pump energy through one of the mirrors. Considerable information concerning surface emitting lasers are set forth in the following references: U.S. Pat. Nos. 5,258,990, 4,999,842, and 4,718,070.

Since the pump energy is transmitted into the laser cavity through one of the DFB mirrors, the reflectance of the mirrors is typically reduced at the pump energy wavelength. While this decrease in reflectivity enhances the transmission of the pump energy into the cavity, it also limits the time the pump energy will resonate within the cavity before being transmitted back through one of the DFB mirrors. As a result, the pump energy has a limited opportunity to induce population inversion prior to being transmitted back out of the cavity, thus limiting the efficiency of the laser.

SUMMARY OF THE INVENTION

In accordance with the present invention, a surface emitting laser includes a substrate, a first distributed feedback mirror formed on the substrate, and an active gain medium formed on the first mirror. The active gain medium includes at least one active, optically emitting layer and one barrier layer. A second distributed feedback mirror is formed on the active gain medium. The first and second mirrors define a resonant cavity for supporting a standing wave optical field at a designed wavelength of operation The first and second mirrors have first and second reflective bandwidths that respectively include first and second transmissive bandwidths for receiving optical pumping energy. The first and second reflective bandwidths are shifted in wavelength relative to one another so that the first and second transmissive bandwidths are located at distinct wavelengths.

By shifting the location of the first and second transmissive bandwidths with respect one another, optical pump energy transmitted into the cavity through one of the mirrors will be highly reflected from the other mirror rather than being transmitted therethrough. As a result, the pumping energy will remain in the cavity for a longer period time, increasing the fraction of the pumping energy employed to induce population inversion. In comparison to prior surface emitting lasers, the inventive laser is fast with less lossy energy transfer and it can operate at room temperature without being cooled.

DETAILED DESCRIPTION

Figure 1:
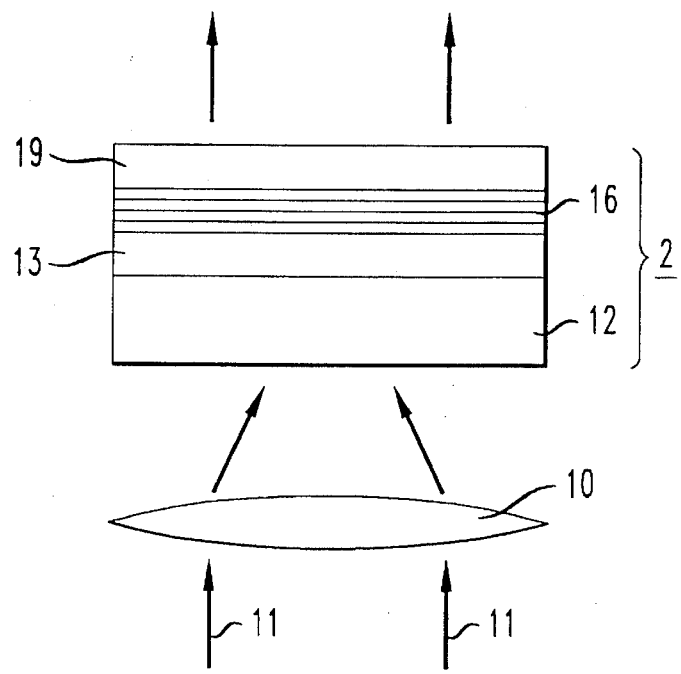
FIG. 1 shows a cross-sectional view of a surface emitting laser.

FIG. 1 depicts an optically pumped surface emitting laser 2. A lens 10 directs incoming radiation through substrate 12 transparent to the radiation and thereafter through distributed feedback (DFB) mirror 13. If the substrate is not transparent to the radiation pumping is performed through the top of the laser 2 rather than through the substrate. The DFB mirror 13 is formed from alternating pairs of high and low refractive index material. Radiation is thereafter introduced into gain medium 16, which is formed from alternating layers of active material and barrier material. The laser is completed by DFB mirror 19 which is also formed from alternating pairs of high and low refractive index material. In the arrangement shown, the emitted lasing beam emerges vertically upward as shown by the arrows.

Figure 2:
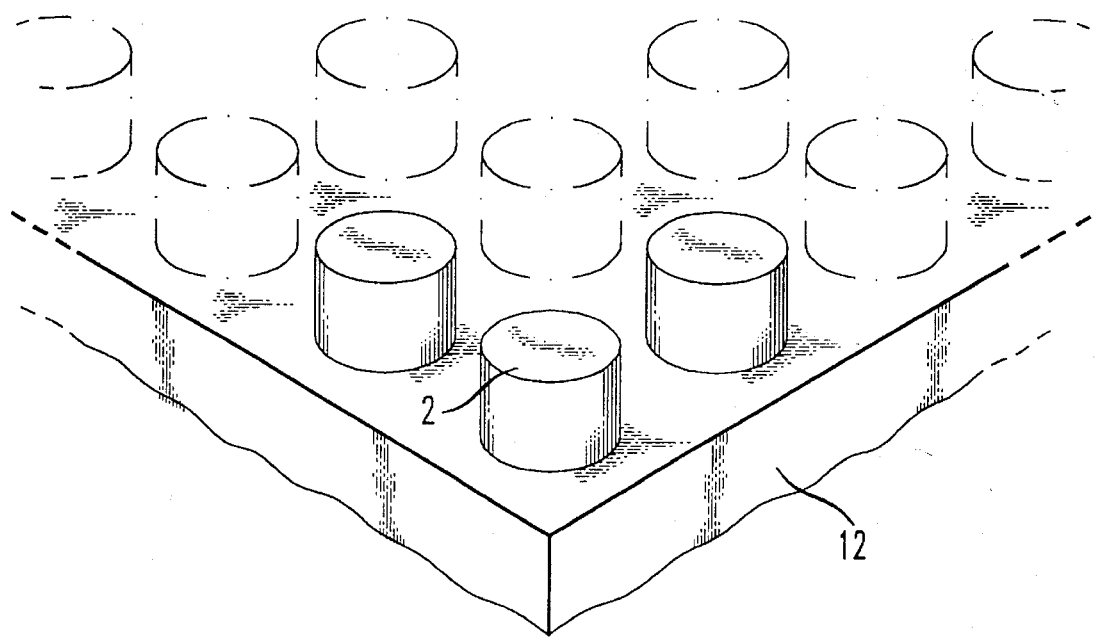
FIG. 2 shows a perspective view of a monolithic array of surface emitting lasers.

FIG. 2 depicts a monolithic array of lasers 2 which are individually similar in composition to the laser shown in FIG. 1. The lasers 2 are all formed on a single substrate. Such arrays are useful as optical interconnects for integrated circuitry and as sources for optical pumping of solid state lasers.

In operation, top and bottom mirrors 19 and 13 form a resonant cavity which supports a standing wave optical field at the designed wavelength of operation. Accordingly, the total thickness of the gain medium 16 is selected to be an integral multiple of one half the designed wavelength. The thickness of the active and barrier layers may be advantageously chosen so that the active layers coincide with the antinodes (i.e. intensity maxima) of the standing wave. This arrangement ensures that the active layers amplify the optical wave as efficiently as possible.

The general structure and composition of the device shown in FIG. 1 is well-known to those skilled in art. The present invention does not depend on designation of appropriate lasing compositions. In general, the selected materials must have properties known to be appropriate for operation. Active material must have a direct energy bandgap suitable for the desired radiation wavelength, and must otherwise be suitable for lasing. Barrier material, a direct or indirect bandgap material, has a higher energy gap and serves to confine carriers within the active material. In general, appropriate direct bandgap materials include the compound semiconductors such as selected materials of the III–V, the II–VI and the ternaries, quaternaries, as well as other complex compositions. Illustrative active material and barrier material pairs that may be employed include GaAs/AlGaAs, $In_{0.53}Ga0_{0.47}As/InP$, $In_{0.2}Ga_{0.8}As/GaAs$, which respectively have lasing wavelengths of 0.87 microns, 1.55 microns, and 1 micron. The fabrication details of the inventive laser 2 are well-known to those skilled in the art. The device may be constructed by any appropriate technique such as MBE or MOCVD, for example. The device may also be constructed with a wedge-shaped laser cavity such as disclosed in U.S. Pat. No. 4,395,769.

Figure 3:
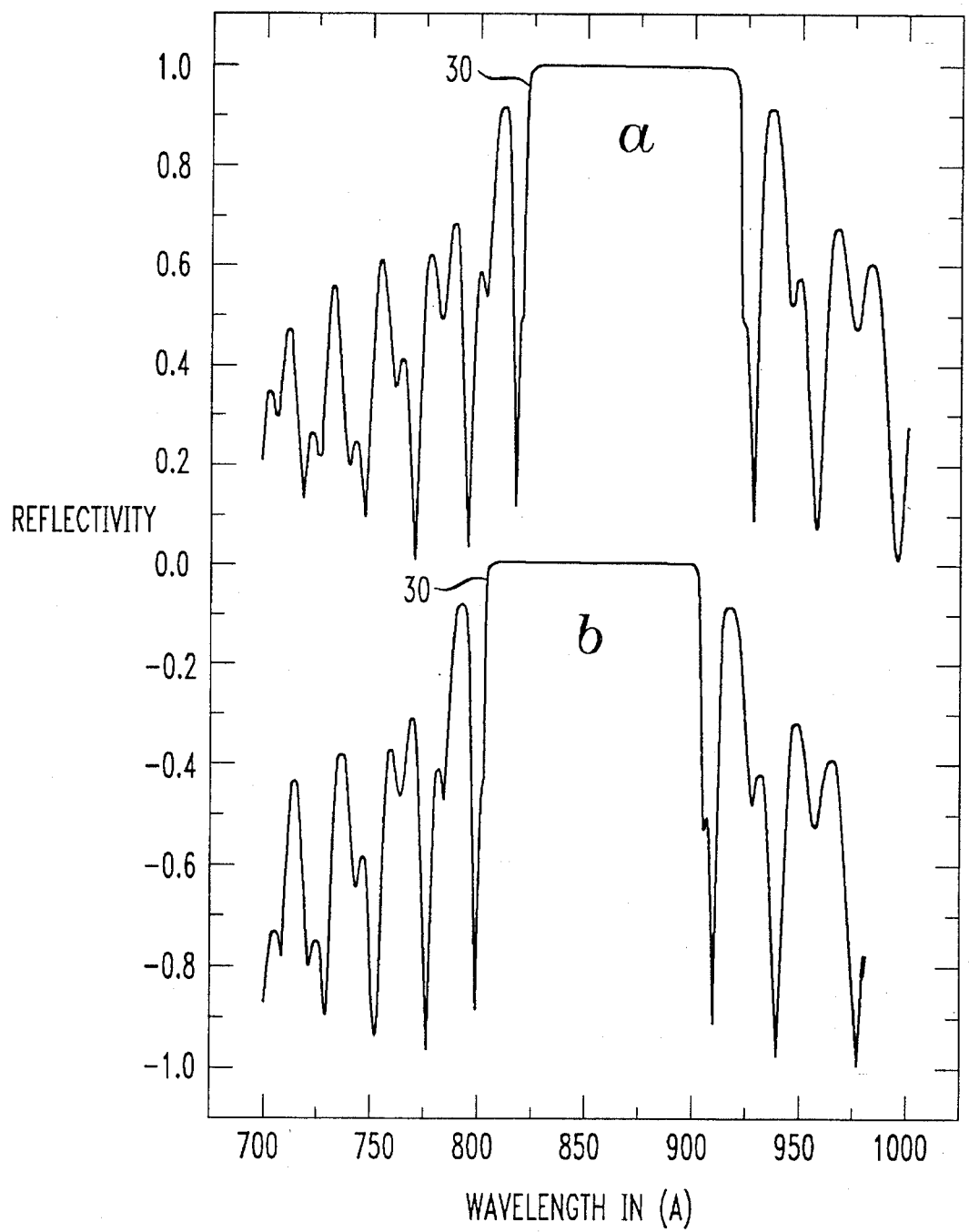
FIG. 3 shows a reflectivity curve for the top distributed feedback mirror and the bottom distributed feedback mirror which are employed in the surface emitting laser of the present invention.

DFB mirror structures are again well-known. The basic requirement is for alternating layers of relatively high and low refractive index having thicknesses sufficient to permit resonance. FIG. 3 shows the reflectivity curve for the top mirror 19, which illustrates the mirror's reflectivity as a function of wavelength. The mirror 19 is configured as in the conventional manner to have maximum reflectivity at the designed wavelength of operation, which in the example shown in FIG. 3 is approximately 870 nm. This maximum reflectivity is approximately maintained over a prescribed bandwidth that encompasses the designed wavelength. The prescribed high reflectivity bandwidth is disturbed by a "notch" 30 defining a relatively narrow bandpass over which the reflectivity decreases substantially. That is, the notch 30 defines a bandwidth over which the mirror 19 transmits a significant amount of optical energy. The pump energy 11 indicated in FIG. 1, which is employed to induce population inversion in the gain medium 16, is typically supplied at a wavelength corresponding to the notch 30. By supplying pump energy at this wavelength a significant fraction of the energy reaches the gain medium 16. If instead a pump energy were selected which had a wavelength more nearly equal to the designed wavelength of operation, most of the energy would be reflected from the top mirror 19 and population inversion would not occur.

Known surface emitting lasers employ top and bottom mirrors that have substantially identical normalized reflectivity curves such as shown in FIG. 3. That is, both mirrors typically employ the same high reflectivity bandwidth and both employ a "notch" at the same wavelength defining a region of higher transmission. This known configuration limits the efficiency of the laser because a significant portion of the pump energy that is not absorbed by the gain medium 16 will be transmitted through the notch in the bottom mirror and hence will be unavailable to induce additional population inversion.

In accordance with the present invention, the top and bottom mirrors 13 and 19 are configured so that their reflectivity curves are shifted in wavelength relative to one another. That is, the reflectivity curves are displaced so that the notch in the top mirror is located at a different wavelength from the notch in the bottom mirror. This arrangement is indicated by the displacement of the reflectivity curve for the top mirror shown in FIG. 3(a) relative to the reflectivity curve for the bottom mirror shown in FIG. 3(b). In particular, the curves are displaced so that the notch in the top mirror is located at a wavelength at which the bottom mirror exhibits relatively high reflectivity. As a result of this arrangement a substantial portion of the pump energy transmitted through the notch in the top mirror is reflected from the bottom mirror back up through the gain medium 16. The reflected pump energy then traverses the gain medium 16 for a second time, increasing its opportunity to induce population inversion. For example, if 50% of the pump energy is absorbed upon a single pass through the gain medium, then by increasing the reflectivity of the bottom mirror, 75% of the pump energy will be absorbed upon traversing the gain medium 16 for a second time. By contrast, in known surface emitting lasers most of the pump energy has only a single opportunity to be absorbed by the gain medium 16.

The optimal shift in the reflectivity curves for the top and bottom mirrors may be individually tailored for each particular device application. However some general considerations are appropriate independent of any particular application. For example, the relative shift should be sufficiently small so that that there is substantial overlap between the high reflectivity bandwidths of the top and bottom mirrors. This criteria ensures that a standing wave will be supported at the designed wavelength. For instance, a shift approximately equal to one-third of the high reflectivity bandwidth often will be appropriate. If the relative shift is too great one of the mirrors will have a reflectivity at the designed wavelength which is too low to efficiently support a standing wave.

The gain medium 16 may be advantageously chosen so that approximately 50% of the pump energy is absorbed when traversing the gain medium for the first time. As noted above, this will cause approximately 75% of the pump energy to be absorbed after traversing the gain medium 16 twice. If substantially more than 50% of the pump energy is absorbed on the first pass, population inversion will occur in a nonuniform manner.

Figure 4:
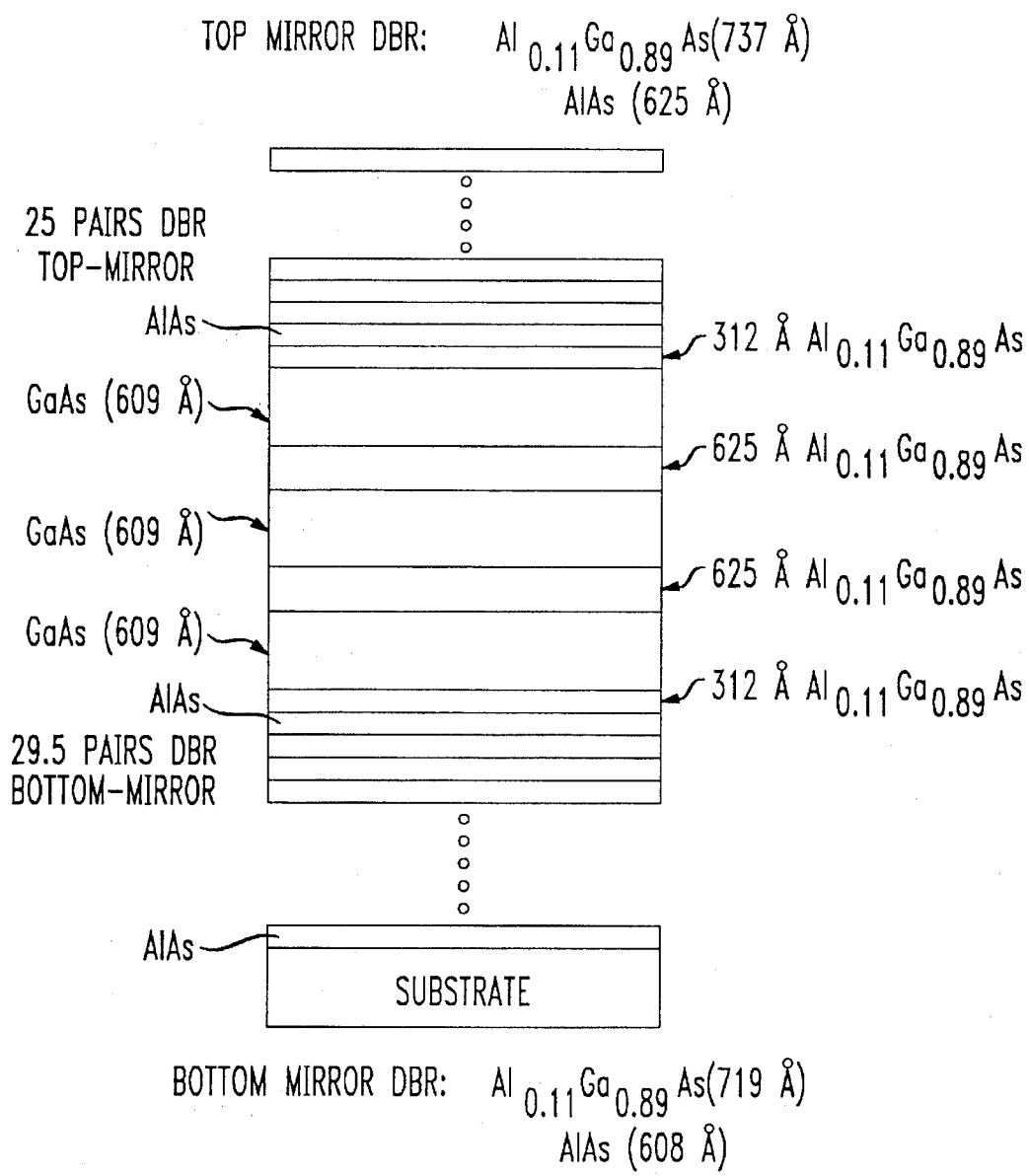
FIG. 4 shows one embodiment of the surface emitting laser constructed in accordance with the present invention.

FIG. 4 shows one particular embodiment of the inventive laser designed to operate at a wavelength of 870 nm. The top mirror 19 is formed from 25 pairs of alternating layers of $Al_{0.11}Ga_{0.89}As$ (737 Å) and AlAs (625 Å) and the bottom mirror is formed from 29.5 pairs of $Al_{0.11}Ga_{0.89}As$ (719 Å) and AlAs (608 Å). The gain medium is formed from three active layers of GaAs (609 Å) each separated by barrier layers of $Al_{0.11}Ga_{0.89}As$ (625 Å). A barrier layer of $Al_{0.11}Ga_{0.89}As$ (312 Å) is interposed between the active layers and each of the mirrors 13 and 19. The active layers are located at the antinodes of the standing wave supported between the mirrors 13 and 19 to maximize efficiency. The high reflectivity bandwidth of the bottom mirror 13 is shifted by approximately 14 nm relative to the top mirror 19. The mirrors 13 and 19 are also "unbalanced," as this term is defined in U.S. Pat. No. 4,999,842, for example. That is, the bottom mirror 13 employs a greater number of alternating layers than the top mirror 19. As a result, the reflectivity of the bottom mirror 13 is greater than the reflectivity of the top mirror 19 at the design wavelength. The optical output beam will be emitted from the top mirror 19 because of its decreased reflectivity relative to the bottom mirror 13. The notch in the top mirror 19 is fully transmitting at the pump wavelength and is only 40–50 meV higher than the cavity mode wavelength, which is within the homogenous line width of the gain medium 16. As a result the laser is faster, more efficient with even coherent energy transfer, all of which decreases non-radiative losses.

I claim:

1. A surface emitting laser comprising:

a substrate;

a first distributed feedback mirror comprising a plurality of layers formed on the substrate;

an active gain medium formed on the first mirror comprising at least one active, optically emitting layer and one barrier layer;

a second distributed feedback mirror comprising a plurality of layers formed on the active gain medium, said first and second mirrors defining a resonant cavity for supporting a standing wave optical field at a designed wavelength of operation;

said first and second mirrors having first and second reflective bandwidths that respectively include first and second transmissive bandwidths for receiving optical pumping energy, said first and second reflective bandwidths being shifted in wavelength relative to one another such that the first and second transmissive bandwidths are located at distinct wavelengths.

2. The laser of claim 1 wherein said distributed feedback mirrors comprise alternating layers of high and low refractive index material.

3. The laser of claim 2 wherein the active gain medium is of a family selected from the group consisting of III–V's, II–VI's, ternary, and quaternary semiconductors.

4. The laser of claim 2 wherein said first mirror consists of 29.5 pairs of alternating layers of $Al_{0.11}Ga_{0.89}As$ and AlAs having thicknesses of 719 and 608 Å, respectively, 5. The laser of claim 4 wherein said second mirror consists of 25 pairs of alternating layers of $Al_{0.11}Ga_{0.89}As$ and AlAs having thicknesses of 737 and 625 Å, respectively.

6. The laser of claim 5 wherein said gain medium consists of three active layers of GaAs each having a thickness of 609 Å separated by two barrier layers of $Al_{0.11}Ga_{0.89}As$ each having a thickness of 625 Å.

7. The laser of claim 1 wherein said optically emitting layers are situated to coincide with intensity maxima of the standing wave optical field.

8. The laser of claim 1 wherein said active gain medium is configured such that approximately 50% of the optical pump energy induces population inversion upon traversing the resonant cavity a single time.

9. The laser of claim 1 wherein said wavelength shift is sufficiently small to maintain substantial overlap between said first and second reflective bandwidths.

10. The laser of claim 9 wherein said wavelength shift is equal to less than one-third of the first reflective bandwidth.

11. The laser of claim 1 wherein said transmissive bandwidth transmits substantially all the pump energy at an energy 40–50 MeV above a mode supported in the resonant cavity.

12. A monolithic laser array comprising:

a plurality of surface emitting lasers formed on a common substrate, each of said surface emitting lasers including:

a first distributed feedback mirror comprising a plurality of layers formed on the substrate;

an active gain medium formed on the first mirror comprising at least one active, optically emitting layer and one barrier layer;

a second distributed feedback mirror comprising a plurality of layers formed on the active gain medium, said first and second mirrors defining a resonant cavity for supporting a standing wave optical field at a designed wavelength of operation;

said first and second mirrors having first and second reflective bandwidths that respectively include first and second transmissive bandwidths for receiving optical pumping energy, said first and second reflective bandwidths being shifted in wavelength relative to one another such that the first and second transmissive bandwidths are located at distinct wavelengths.

* * * * *